(12) United States Patent
Yamashita et al.

(10) Patent No.: US 10,568,243 B2
(45) Date of Patent: Feb. 18, 2020

(54) ELECTRONIC COMPONENT SUPPLY SYSTEM

(71) Applicant: FUJI CORPORATION, Chiryu-shi (JP)

(72) Inventors: Yukihiro Yamashita, Toyohashi (JP); Hiroaki Muratsuchi, Hashima-gun (JP)

(73) Assignee: FUJI CORPORATION, Chiryu-shi (JP)

( * ) Notice: Subject to any disclaimer, the term of this patent is extended or adjusted under 35 U.S.C. 154(b) by 83 days.

(21) Appl. No.: 15/539,374

(22) PCT Filed: Dec. 26, 2014

(86) PCT No.: PCT/JP2014/084583
§ 371 (c)(1),
(2) Date: Jun. 23, 2017

(87) PCT Pub. No.: WO2016/103472
PCT Pub. Date: Jun. 30, 2016

(65) Prior Publication Data
US 2017/0354069 A1     Dec. 7, 2017

(51) Int. Cl.
*B23P 19/00*     (2006.01)
*H05K 13/02*     (2006.01)
(Continued)

(52) U.S. Cl.
CPC ......... *H05K 13/02* (2013.01); *H05K 13/0434* (2013.01); *H05K 13/085* (2018.08);
(Continued)

(58) Field of Classification Search
CPC ........... Y10S 156/941; Y10T 156/1994; Y10T 29/53174; Y10T 29/4913; Y10T 29/53178;
(Continued)

(56) References Cited

U.S. PATENT DOCUMENTS

| | | | | |
|---|---|---|---|---|
| 5,371,940 | A | * 12/1994 | Suzuki | ................. B23P 21/004 29/703 |
| 2003/0053300 | A1 | 3/2003 | Suhara et al. | |
| 2012/0285628 | A1 | 11/2012 | Katsumi et al. | |

FOREIGN PATENT DOCUMENTS

| | | |
|---|---|---|
| DE | 10 2012 221 259 A1 | 5/2014 |
| JP | 4-346500 A | 12/1992 |

(Continued)

OTHER PUBLICATIONS

International Search Report dated Feb. 3, 2015, in PCT/JP2014/084583, filed Dec. 26, 2014.
(Continued)

*Primary Examiner* — Thiem D Phan
(74) *Attorney, Agent, or Firm* — Oblon, McClelland, Maier & Neustadt, L.L.P.

(57) ABSTRACT

Provided is an electronic component supply system determining the types of electronic components installed on component pallets at a time when the electronic components are installed on the component pallets for installation, which determines the types of the electronic components installed on the component pallets based on planned multiple jobs continuously performed by multiple electronic component mounting machines to which the component pallets are attached and an execution order for the jobs such that the number of the component pallets exchanged during job switching is minimized.

3 Claims, 2 Drawing Sheets

(51) Int. Cl.
*H05K 13/08* (2006.01)
*H05K 13/04* (2006.01)

(52) U.S. Cl.
CPC ....... *H05K 13/086* (2018.08); *H05K 13/0857* (2018.08); *Y10T 29/53174* (2015.01)

(58) Field of Classification Search
CPC ........ Y10T 29/53022; Y10T 29/53435; H05K 13/021; H05K 13/0408; H05K 13/0417; H05K 13/0419; H05K 13/02; H05K 13/086; H05K 13/0434; H05K 13/0857; H05K 13/085; H05K 13/08; H05K 13/0084; H05K 13/04
USPC .................. 29/739, 705, 709, 740, 829, 832
See application file for complete search history.

(56) References Cited

FOREIGN PATENT DOCUMENTS

| | | |
|---|---|---|
| JP | 2003-92492 A | 3/2003 |
| JP | 2011-138834 A | 7/2011 |
| JP | 2012-134565 A | 7/2012 |

OTHER PUBLICATIONS

Extended European Search Report dated Nov. 28. 2017 in Patent Application No. 14909076.3.
Office Action dated Oct. 1, 2018 in corresponding Japanese Patent Application No. 2016-565816, 3 pages.

* cited by examiner

FIG.2

|  | 10a | 10b | 10c | 10d |
|---|---|---|---|---|
| JOB1 | pallet1 | pallet2 | pallet3 | pallet4 |
| JOB2 | | | | |
| JOB3 | | | ↓ | |
| JOB4 | | | pallet5 | |
| JOB5 | | | | |
| JOB6 | | | | |
| JOB7 | | | | ↓ |
| JOB8 | | | | pallet6 |
| JOB9 | | | | |
| JOB10 | ↓ | ↓ | ↓ | ↓ |

ELECTRONIC COMPONENT SUPPLY SYSTEM

TECHNICAL FIELD

The present description relates to an electronic component supply system. More particularly, the present description relates to a system that supplies electronic components to an electronic component mounting machine by exchanging component pallets where multiple component cartridges accommodating electronic components are installed.

BACKGROUND ART

JP-A-4-346500 (hereinafter, referred to as PTL 1) discloses a supply system that supplies an electronic component mounting machine with component pallets at a time when multiple types of mounting boards are manufactured. Multiple component cartridges can be installed on the component pallets according to PTL 1. PTL 1 specifies the types of electronic components mounted on the mounting boards that are manufactured and groups the mounting boards that are manufactured by itself such that the manufacturing can be performed by the same component pallets being used. In other words, PTL 1 groups the mounting boards that are manufactured when the multiple types of mounting boards are manufactured such that the number of times of component pallet exchange work is minimized. In other words, PTL minimizes the number of times of setup changing for switching between the types of the mounting boards that are manufactured and minimizes the number of times the device has to be stopped.

SUMMARY

PTL 1 minimizes the number of times of the component pallet setup changing and improves the operating ratio of the electronic component mounting machine by adjusting a manufacturing order (grouping the mounting boards that are manufactured). However, PTL 1 does not take the number of the component pallets to be prepared into account. In PTL 1, all of the component pallets are exchanged during switching between the groups of the mounting boards that are manufactured, and thus the number of component pallet exchanges is not at its minimum. For operators preparing the component pallets before the board production, work man-hours increases and steps become complex as the number of the pallets to be prepared each day increases. An object of the present description is to provide an electronic component supply system with which a component pallet preparation step can be simplified compared to the background art.

An electronic component supply system disclosed in the present description determines the types of electronic components installed on component pallets at a time when the electronic components are installed on the component pallets. The electronic component supply system determines the types of the electronic components installed on the component pallets based on planned multiple jobs continuously performed by multiple electronic component mounting machines to which the component pallets are attached and an execution order for the jobs such that the number of the component pallets exchanged during job switching is minimized.

The control device described above determines the types of the electronic components installed on the component pallets based on the multiple jobs and the execution order for the jobs such that the number of the component pallets exchanged during the job switching is minimized. A component pallet preparation step can be simplified based on the minimization of the number of the exchanged component pallets.

BRIEF DESCRIPTION OF DRAWINGS

FIG. 2 is a diagram illustrating a relationship between jobs performed by the electronic component mounting system and component pallets that are used.

DESCRIPTION OF EMBODIMENTS

Figure 1:
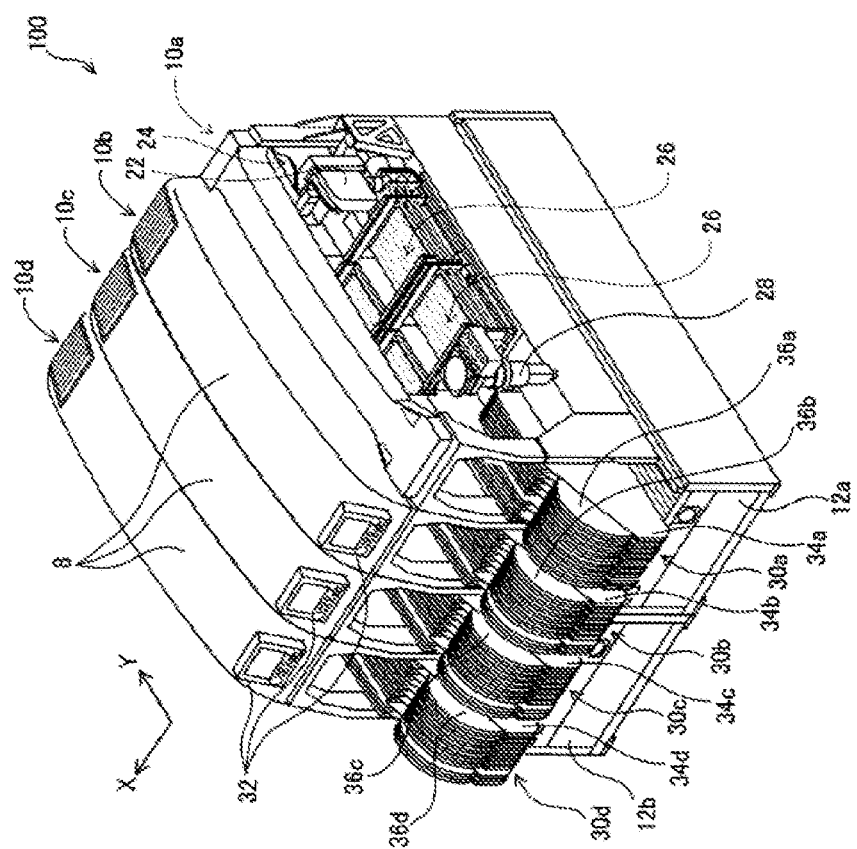
FIG. 1 is a diagram illustrating an appearance of an electronic component mounting system.

Hereinafter, some technical features of an electronic component supply system disclosed in the present description will be described. Each of the items that will be described below has its own technical usefulness.

The electronic component supply system determines the types of electronic components installed on component pallets at a time when the electronic components are installed on the component pallets. Component cartridges may be installed on the component pallets with multiple electronic components that are of the same type accommodated in the component cartridges. The component pallet may be provided with multiple slots accommodating the electronic component. The component supply system may be a control device accommodated in an electronic component mounting machine (or an electronic component mounting system provided with multiple electronic component mounting machines). Alternatively, the component supply system may determine an installation position of the electronic component on the component pallet on the outside of the electronic component mounting machine.

The types of the electronic components installed on the component pallets may be determined based on planned multiple jobs continuously performed by the multiple electronic component mounting machines to which the component pallets are attached and an execution order for the jobs such that the number of the component pallets exchanged during job switching is minimized. The types of the electronic components installed on the component pallets may also be determined based on a job planned to be performed before driving of the electronic component mounting machine (manufacturing of a mounting board) is started or determined when the job planned to be performed is changed based on the job that follows the change. The types of the electronic components installed on the component pallets may also be determined during component pallet exchange such that more jobs are carried out after the component pallet exchange.

The types of the electronic components installed on the exchanged component pallets may be determined such that the electronic component not used in the job before the switching and used in the job after the switching is installed on one of the component pallets.

The electronic component mounting machine subjected to the component pallet exchange may be determined during the component pallet exchange based on the electronic components installed on the component pallets respectively attached to the multiple electronic component mounting machines and the electronic component used in the job performed after the component pallet exchange. In this case, the electronic component mounting machine subjected to the component pallet exchange may be determined such that more jobs are carried out after the component pallet exchange.

When the electronic components are accommodated in the component pallets, the electronic components may be accommodated in the slots in the job execution order and the electronic components may be accommodated such that the number of the slots accommodating no electronic component is minimized. In addition, in a case where the electronic component used in the next job is accommodated in none of the component pallets and any one of the component pallets is provided with the slot accommodating no electronic component during the job switching, the electronic component used in the next job may be accommodated in the slot accommodating no electronic component without the component pallets being exchanged.

Embodiment

Hereinafter, the electronic component supply system disclosed in the present description and the electronic component mounting machines used in the electronic component supply system will be described with reference to accompanying drawings. An electronic component mounting system 100 will be described first with reference to FIG. 1. The electronic component mounting system 100 is provided with four electronic component mounting machines 10a, 10b, 10c, and 10d. Each of the electronic component mounting machines 10a to 10d is a device for mounting an electronic component on a printed circuit board. In some cases, the electronic component mounting machines 10a to 10d (or the electronic component mounting system 100) are referred to as surface mounting machines or chip mounters. In the following description, the direction in which the electronic component mounting machines 10a to 10d line up will be referred to as an X direction and the horizontal direction that is perpendicular to the X direction will be referred to as a Y direction.

The electronic component mounting machines 10a to 10d have substantially the same structure. Accordingly, the electronic component mounting machine 10a will be described below with description of the electronic component mounting machines 10b to 10d omitted in some cases. In the following description, alphabets attached to reference numerals will be omitted in some cases from description of identical components. In addition, an upper cover 8 is not illustrated in the drawing so that an internal structure of the electronic component mounting machine 10a is shown. The electronic component mounting machine 10a is provided with board conveyance devices 26, a component supply device 12a, and a mounting head 22 receiving a component from the component supply device 12a and mounting it on the board held by the board conveyance devices 26. The component supply device 12a is provided with a component pallet 34a attachably and detachably holding multiple component cartridges 30a. The component pallet 34a has multiple slots and the component cartridges 30a are attachably and detachably installed in the respective slots. Multiple component reels 36a are attachably and detachably installed in the component cartridges 30a. Each of the component reels 36a accommodates multiple electronic components. The component cartridges 30a supply the electronic components to the mounting head 22. The electronic component mounting machines 10b to 10d are provided with component cartridges 30b to 30d, component pallets 34b to 34d, and component reels 36b to 36d as is the case with the electronic component mounting machine 10a.

The number of the board conveyance devices 26 that the electronic component mounting machine 10a is provided with is two. Each of the board conveyance devices 26 conveys the printed circuit board in the X-direction. Each of the board conveyance devices 26 is connected in series to board conveyance devices 26 of the electronic component mounting machines 10b to 10d. The electronic component mounting machine 10a is provided with the mounting head 22 and a head moving device 24 moving the mounting head 22 in the X-direction and the Y-direction. The head moving device 24 moves the mounting head 22 in a predetermined order with respect to the component cartridge 30 and the printed circuit board on the board conveyance devices 26. A suction nozzle is disposed in the mounting head 22 and the suction nozzle picks up the electronic component from the component cartridge 30, holds it, conveys it to the printed circuit board on the board conveyance devices 26, and mounts it. After the electronic component mounting is completed, the board conveyance devices 26 send the printed circuit board to the board conveyance device of the electronic component mounting machine 10b. The electronic component mounting machine 10b performs the same operation as the electronic component mounting machine 10a and sends the printed circuit board to the board conveyance device of the electronic component mounting machine 10c after electronic component mounting is completed. The electronic component mounting machine 10c performs the same operation as the electronic component mounting machines 10a and 10b and sends the printed circuit board to the board conveyance device of the electronic component mounting machine 10d after electronic component mounting is completed.

The electronic component mounting machine 10a is provided with a component imaging device (camera) 28 as well. When the mounting head 22 passes above the camera 28, the camera 28 captures an image of the suction nozzle attached to the mounting head 22 and images the shape of the electronic component held by the suction nozzle. A monitor 32, which is an input and output device, is disposed in an upper portion of the electronic component mounting machine 10a (refer to the electronic component mounting machines 10b to 10d). Various settings with respect to the electronic component mounting machine 10a can be input to a control device by the monitor 32 being used. The control device (not illustrated) is accommodated in the electronic component mounting machine 10a.

The electronic component mounting system 100 is capable of manufacturing different types of mounting boards (electronic component-mounted printed circuit boards) by the component cartridges 30a to 30d supplied to the electronic component mounting machines 10a to 10d being exchanged. In the electronic component mounting system 100, any one of the component pallets 34a to 34d can be subjected to component pallet-specific exchange during a change in the type of the mounting board that is manufactured (hereinafter, referred to as "job switching" in some cases) in a case where each of the electronic component mounting machines 10a to 10d is not provided with a component cartridge accommodating an electronic component used after job switching.

FIG. 2 shows the types of the component pallets supplied to the electronic component mounting machines 10a to 10d at a time when job 1 to job 10 are performed by the use of the electronic component mounting system 100. In the present embodiment, component pallets 1 to 4 are first supplied to the electronic component mounting machines 10a to 10d before job 1 is started. Then, the electronic component mounting machine 10a uses component pallet 1 until job 10 is completed. The electronic component mounting machine 10b uses component pallet 2 until job 10 is completed. The electronic component mounting machine 10c uses component pallet 3 until job 3 is completed, exchanges it for component pallet 5 after job 3 is completed, and uses component pallet 5 until job 10 is completed. The electronic component mounting machine 10d uses component pallet 4 until job 7 is completed, exchanges it for component pallet 6 after job 7 is completed, and uses component pallet 6 until job 10 is completed. In the present embodiment, the component pallets are exchanged twice for the execution of job 1 to job 10. In other words, six component pallets are prepared for the execution of job 1 to job 10.

As described above, the electronic component mounting machines 10a to 10d have substantially the same structure. Accordingly, the component pallets of the electronic component mounting machines other than the electronic component mounting machines 10c and 10d can be exchanged after job 3 and job 7 are completed. In the electronic component mounting system 100, however, the electronic component mounting machine subjected to the component pallet exchange and the types of the component cartridges installed on the component pallets are determined and a component pallet preparation step is simplified as follows.

The types of the component cartridges installed on the component pallets are determined based on the electronic components used in jobs 1 to 10 and an execution order for jobs 1 to 10 such that the number of the exchanged component pallets is minimized. In other words, the electronic component mounting machine subjected to the component pallet exchange and the types of the component cartridges installed on the component pallets are determined such that the number of the component pallets prepared for the execution of jobs 1 to 10 is minimized.

Specifically, in the case of the embodiment illustrated in FIG. 2, pallets 1 to 4 are selected first as the component pallets used when production is started in the electronic component mounting machines 10a to 10d. Then, the component cartridge used in job 1 is determined such that it is installed in the slot of any one of pallets 1 to 4. At this time, it is determined whether to install each component cartridge on any one of pallets 1 to 4 such that the lengths of time of mounting work by the respective electronic component mounting machines 10a to 10d in job 1 are averaged. At this point in time, pallets 1 to 4 have empty slots, where a determination has yet to be made as to component cartridge installation.

Then, the component cartridge used in job and accommodating a type of electronic component not installed in any of the slot of pallets 1 to 4 yet is installed in one of the empty slots. Processing for installing the component cartridges accommodating the electronic components that have yet to be installed in the empty slots is sequentially repeated with regard to job 3 and the following jobs as well.

Once the processing for determining the component cartridge installation position (slot) described above is repeated, insufficiency arises in any one of the jobs regarding the empty slot where the component cartridge used in that job is installed (job 4 in FIG. 2). In this case, checking is performed with regard to a case where any one of the pallets used by the electronic component mounting machines 10a to 10d has been exchanged for a new component pallet (pallet 5) where no component cartridge is installed. For example, the checking is performed with regard to a case where pallet 1 has been exchanged for pallet 5. Determination processing regarding the position of installation of the component cartridge used in job 4 and the following jobs is performed by the use of the exchanged pallets (pallets 5, 2, 3, and 4) and the rest of jobs allowing electronic component installation are checked. In other words, the rest of jobs allowing component installation in a case where pallet 1 has been exchanged for pallet 5 and an appropriate electronic component (component cartridge) has been installed on pallet 5 are checked. Likewise, the rest of jobs allowing component installation are checked with regard to cases where the other pallets (pallets 2 to 4) have been exchanged.

The checking described above is performed, a determination is made as to which one of the pallets (1 to 4) allows electronic component installation up to the earliest job in a case where it is exchanged, and the pallet is selected as the pallet to be exchanged. In the case of FIG. 2, electronic component installation is allowed up to the earliest job (job 7 in FIG. 2) in a case where pallet 3 is exchanged. In contrast, component installation is allowed only up to job 6 in a case where the other pallets are exchanged. Accordingly, in job 4, a determination is made for pallet 3 to be exchanged for pallet 5 and a determination is made as to the position (slot) of installation of the component used in jobs 4 to 7 in that case. Likewise, in a case where the pallet to be exchanged after the completion of job 7 is selected, similar processing is performed in job 8 and the following jobs and the pallet to be exchanged and the arrangement position of component used in each job are determined. As a result of the processing described above, the number of the exchanged component pallets can be minimized.

The execution of up to job 10 that is allowed by the exchange of component pallet 4 of the electronic component mounting machine 10d described above can be determined based on the types and number of the electronic components accommodated in component pallets 1, 2, 4, and 5 attached to the electronic component mounting machines 10a to 10d and the types and number of the electronic components used in job 8 and the following jobs. In addition, during the determination of the types of the component cartridges installed on component pallet 6, the component cartridges accommodating the electronic components not used before the switching (job 1 to 7) and used in the jobs after the switching (job 8 and the following jobs) are collectively installed with respect to component pallet 6. In this manner, a larger number of the component cartridges used in job 8 and the following jobs can be installed on component pallet 6 and a larger number of jobs can be performed after a change from component pallet 4 to component pallet 6.

The electronic component mounting machine subjected to the component pallet exchange and the types of the component cartridges installed on the component pallets may be determined offline or may be determined by the control device in the electronic component mounting system 100 with information on the mounting board that is manufactured (such as the types of the electronic components that are used and the job execution order) input to the electronic component mounting system 100.

Specific examples of the present disclosure have been described in detail above, these examples are merely examples, and these examples do not limit the scope of claims. The technique that is described in the scope of claims also includes various modifications and changes based on these specific examples described above. The technical elements that are described the present description or the drawings demonstrate their technical usefulness on their own or in various combinations and are not limited to the combinations described in the claims at the time of application. The technique exemplified in the present description or the drawings achieves multiple purposes at the same time and maintains its technical usefulness even when it achieves only one of the purposes.

The invention claimed is:

1. An electronic component supply system determining types of electronic components installed on component pallets, comprising:
    control circuitry configured to determine the types of the electronic components installed on the component pallets based on planned multiple jobs continuously performed by multiple electronic component mounting machines to which the component pallets are attached and an execution order for the jobs such that the number of the component pallets exchanged during job switching is minimized,
    wherein the electronic component mounting machines are arranged in series and one of the component pallets is connected respectively to the electronic component mounting machines,
    wherein the control circuitry determines which of the component pallets connected to the component mounting machines is a pallet to be exchanged based on a number of jobs remaining of the multiple jobs after a component pallet exchange, and
    wherein the control circuitry determines the types of the electronic components on the pallet to be exchanged during the component pallet exchange after completion of a predetermined number of the multiple jobs is based on a number of components not used on pallets that remain after the component pallet exchange and on a number of components required by a remaining number of jobs of the planned multiple jobs.

2. The electronic component supply system according to claim 1, wherein the control circuitry determines the types of the electronic components installed on the component pallets during the component pallet exchange such that additional jobs are carried out after the component pallet exchange.

3. The electronic component supply system according to claim 1,
    wherein each of the component pallets is provided with multiple slots accommodating the electronic components, and
    wherein, in a case where a electronic component used in a next job is accommodated in none of the component pallets and any one of the component pallets is provided with a slot accommodating no electronic component during the job switching, the electronic component used in the next job is accommodated in the slot accommodating no electronic component without the component pallets being exchanged.

* * * * *